United States Patent
Abbaspour-Tamijani et al.

(10) Patent No.: US 8,446,232 B2
(45) Date of Patent: May 21, 2013

(54) ULTRA-WIDEBAND TUNABLE FILTERS BASED ON MULTI-RESOLUTION BAND-SELECTION

(75) Inventors: Abbas Abbaspour-Tamijani, Scottsdale, AZ (US); Masoud Koochakzadeh, Vista, CA (US)

(73) Assignee: Arizona Board of Regents for and on Behalf of Arizona State University, Scottsdale, AZ (US)

( * ) Notice: Subject to any disclaimer, the term of this patent is extended or adjusted under 35 U.S.C. 154(b) by 401 days.

(21) Appl. No.: 12/802,196

(22) Filed: Jun. 1, 2010

(65) Prior Publication Data

US 2010/0311383 A1    Dec. 9, 2010

Related U.S. Application Data (60) Provisional application No. 61/217,512, filed on Jun. 1, 2009.

(51) Int. Cl.
     *H01P 1/203*      (2006.01)
     *H01P 7/08*      (2006.01)

(52) U.S. Cl.
     USPC .......................................... 333/205; 333/235

(58) Field of Classification Search
     USPC .............. 333/101, 104, 105, 134, 136, 205, 333/235
     See application file for complete search history.

(56) References Cited

U.S. PATENT DOCUMENTS

| | | | |
|---|---|---|---|
| 5,193,218 A * | 3/1993 | Shimo ............................ | 455/80 |
| 7,046,104 B2 * | 5/2006 | Snyder et al. ................. | 333/205 |
| 2004/0036558 A1 * | 2/2004 | Allison et al. ............... | 333/205 |

OTHER PUBLICATIONS

1973 IEEE Ultrasonics Symposium, vol. SU-21, N10, p. 84, Jan. 1974.
Abbaspour-Tamijani et al., "Miniature and Tunable Filters Using MEMS Capacitors", IEEE Transactions on Microwave Theory & Techniques, vol. 51, No. 7, pp. 1878-1885, Jul. 2003.
Brown et al., "A Varactor-Tuned RF Filter", IEEE Transactions on Microwave Theory & Techniques, vol. 48, No. 7, pp. 1157-1160, Jul. 2000.
Entesari et al., "A 25-75 MHz RF MEMS Tunable Filter", IEEE Transactions on Microwave Theory & Techniques, vol. 55, No. 11, pp. 2399-2405, 2007.
Entesari et al., "A Differential, 4-bit, 6.5-10 GHz RF MEMS Tunable Filter", IEEE Transactions on Microwave Theory & Techniques, vol. 53, No. 3, pp. 1103-1110, 2004.
Hays et al., "Selectable Bandpass Filters-Multichannel Surface Wave Devices", IEEE Ultrasonics Symp. Dig., pp. 456-459,1973.
Karim et al., "A Reconfigurable Micromachined Switching Filter Using Periodic Structures", IEEE Transactions on Microwave Theory & Techniques,vol. 55, No. 6, Jun. 2007.
Koochakzadeh et al., "A Multi-Resolution Channel-Select Filter with Ultra-Wide Frequency Coverage", IEEE MTT-S Int. Microwave Symp. Dig., Atlanta, GA, pp. 431-434, Jun. 2008.

(Continued)

*Primary Examiner* — Benny Lee
*Assistant Examiner* — Gerald Stevens
(74) *Attorney, Agent, or Firm* — Fulbright & Jaworski L.L.P.

(57) ABSTRACT

Devices and methods for tunable RF filtering. Multiple bimodal filter stages are used within a filter device to provide for tunable frequency response of the filter device. The use of M sequential bimodal filter stages, each having different frequency resolutions, may allow for $2^M$ possible modes of operation.

7 Claims, 10 Drawing Sheets

OTHER PUBLICATIONS

Koochakzadeh et al., "Closed-Form Formulas for Predicting the Nonlinear Behavior of All-Pole Bandpass Filters", IEEE Transactions on Microwave Theory & Techniques, vol. 56, No. 3, pp. 575-586, Mar. 2008.

Koochakzadeh et al., "Multiresolution Channel-Select Filter with Ultrawide Frequency Coverage", IEEE Transactions on Microwave Theory and Techniques, vol. 58, No. 5, pp. 1205-1212, May 2010.

Koochakzadeh et al., "Multi-Sclae Tunable Filter Covering a Frequency Range of 6.5:1", IEEE MTT-S Int. Microwave Symp. Dig., Atlanta, pp. 1023-1026, Jun. 2008.

Koochakzadeh et al., "Tunable Filters with Nonuniform Microstrip Coupled Lines", IEEE Microwave and Wireless Components Letters, vol. 18, No. 5, pp. 314-316, May 2008.

Lam et al., "A Configurable Wavelength Demultiplexer Using Periodic Filter Chains", UCLA, Digest of the IEEE/LEOS Summer Topical Meetings, pp. 78-79, 1997.

Lam et al., "A Tunable Wavelength Demultiplexer Using Logarithmic Filter Chains", Journal of Lightwave Technology, vol. 16, No. 9, pp. 1657-1662, Sep. 1998.

Levy et al.,"Synthesis of Symmetrical Branch-Guide Directional Couplers", IEEE Transactions on Microwave Theory & Techniques, vol. MTT-16, No. 2, pp. 80-89, Feb. 1968.

Lutovac et al., "IIR Filters Based on Frequency-Response Masking Approach", Telsiks Conf 2001, pp. 163-170, Sep. 2001.

Park et al.,"Low-Loss 5.15-5.70-GHz RF MEMS Switchable Filter for Wireless LAN Applications", IEEE Transactions on Microwave Theory & Techniques, vol. 54, No. 11, pp. 3931-3939, Nov. 2006.

Park et al., "Reconfigurable Millimeter-Wave Filters Using CPW-Based Periodic Structures with Novel Multiple-Contact MEMS Switches", Journal of Microelectromechanical Systems, vol. 14, No. 3, pp. 456-463, Jun. 2005.

Park, "High-Performance RF-MEMS Tunable Filters", PhD Dissertation, 2008.

Pillans et al., "6-15 GHz RF MEMS Tunable Filters", Int. Microwave Symp. Digest, Jun. 2005.

Rhodes et al., "A Generalized Multiplexer Theory", IEEE Transactions on Microwave Theory and Techniques, vol. MTT-27, No. 2, pp. 99-111, Feb. 1979.

Sanchez-Renedo et al., "A new electronically tunable combline filter with simultaneous continuous control of central frequency and bandwidth", IEEE Transactions on Microwave Theory & Techniques, vol. 53, No. 1, pp. 191-199, Jan. 2004.

Siegel et al., "Very low complexity RF-MEMS technology for wide range tunable microwave filters", 35th European Microwave Conference Proc., vol. 1, pp. 637-640, 2005.

Tang et al., "A Microstrip Ultra-Wideband Bandpass Filter with Cascaded Broadband Bandpass and Bandstop Filters", IEEE Transactions on Microwave Theory & Techniques, vol. 55, No. 11, pp. 2412-2418, Nov. 2007.

Wenzel, "Application of Exact Synthesis Methods to Multichannel Filter Design", IEEE Transactions on Microwave Theory & Techniques,vol. 13, No. 1, pp. 5-15, Jan. 1965.

* cited by examiner

ULTRA-WIDEBAND TUNABLE FILTERS BASED ON MULTI-RESOLUTION BAND-SELECTION

CROSS-REFERENCE TO RELATED APPLICATIONS

This application claims priority to U.S. Provisional Application No. 61/217,512 filed Jun. 1, 2009, the entire contents of which is specifically incorporated herein by reference without disclaimer.

BACKGROUND

1. Field of the Invention

The present invention relates generally to signal filtering, and more particularly to tunable RF filters.

2. Description of the Related Art

Tunable RF filters are useful for software-defined radio applications. Very wideband frequency coverage may be desirable in such applications, often from tens of MHz to several GHz. The tuning requirements may therefore differ greatly from those which are conventionally pursued for civilian telecommunication systems.

Tunable and band-select filters are commonly designed by integrating solid-state/MEMS varactors or switches (Brown and Rebeiz, 2000; Entesari and Rebeiz, 2005; Abbaspour-Tamijani et al., 2003; Siegel et al., 2005; Park et al., 2006; Sanchez-Renedo et al., 2005) within the structure of conventional lumped or distributed bandpass filters. Most commonly, tuning response is attained by changing the capacitors or inductors in the resonators of a bandpass filter. One limitation that arises in most of these structures is caused by the spurious pass-bands that occur due to the higher order resonances. Spurious pass-bands have almost always been treated as undesirable artifacts in band-select filters that are intended to deliver only one frequency band at each mode of operation.

SUMMARY

Embodiments of the present disclosure include tunable RF filter devices having a plurality of filter stages. The filter stages may be connected in series, and each filter stage may include a filter stage input, a filter stage output, a filter stage ground, and one or more first transmission lines. In these embodiments, each first transmission line may be connected to at least two connection nodes, and each connection node may also be connected to (1) either the filter stage input, the filter stage output, or another first transmission line, and (2) one of a plurality of second transmission lines (stubs). Each second transmission line may also be connected to a switching means. The switching means of each filter stage may be configured to operate such that either each of the plurality of second transmission lines within that filter stage is provided an open circuit, or each of the plurality of second transmission lines within that filter stage is connected to the filter stage ground of that filter stage.

In some embodiments, the plurality of filter stages includes a first filter stage, and each first transmission line within the first filter stage may be about the same electrical length ("L1"). In these embodiments, each of the second transmission lines within the first filter stage may be about the same electrical length ("L2"), and the electrical length L1 may be about twice L2.

In some embodiments, the plurality of filter stages includes a second filter stage, and each first transmission line within the first filter stage may be about the same electrical length ("L3"). In these embodiments, each of the second transmission lines within the second filter stage may be about the same electrical length ("L4"). The electrical length L3 may be about L2, and about twice L4.

In some embodiments of the present RF filter devices, the number of second transmission lines within the first filter stage may be N, the number of first transmission lines within the first filter stage may be N−1, the number of second transmission lines within the second filter stage may be N+1, and the number of first transmission lines within the second filter stage may be N.

In some embodiments of the present RF filter devices, the plurality of filter stages includes M filter stages, each of which may be denoted as a filter stage of index m, where m is a positive integer ranging from 1 to M. In these embodiments, each first transmission line within the filter stage of index m may be of about the same electrical length, which may be denoted as $L1(m)$, and each of the second transmission lines within the filter stage of index m may be of about the same electrical length, which may be denoted as $L2(m)$. In these embodiments, $L1(m)$ may be about twice $L2(m)$, $L1(m+1)$ may be about $L2(m)$, and $L1(m+1)$ may be about twice $L2(m+1)$.

In some of these embodiments, the number of second transmission lines within the filter stage of index m is N, the number of first transmission lines within the filter stage of index m may be N−1, the number of second transmission lines within the filter stage of index (m+1) may be N+1, and the number of first transmission lines within the filter stage of index (m+1) may be N.

Embodiments of the present disclosure also include tunable RF filter devices having a first filter stage and a second filter stage that are connected in cascade, where the first filter stage may be configured for bimodal operation and can produce a first frequency response to an input RF signal. In these embodiments, the second filter stage may be configured for bimodal operation and can produce a second frequency response to the input RF signal, and the first frequency response and the second frequency response are different.

Some embodiments of the present RF filter devices also include a third filter stage that is connected in cascade with the second filter stage, where the third filter stage may be configured for bimodal operation and can produce a third frequency response to the input RF signal. In these embodiments, the third frequency response is different than each of the first frequency response and the second frequency response.

Some embodiments of the present RF filter devices also include M filter stages that are connected in cascade, each of which may be denoted as a filter stage of index m, where m is a positive integer ranging from 1 to M. Each filter stage m may be configured for bimodal operation and can produce an m'th frequency response to the input RF signal. In these embodiments, the m'th frequency response is different than the frequency responses of each of the other M−1 stages.

Some embodiments of the RF filter devices are implemented as integrated circuits.

Embodiments of the present disclosure also include methods for filtering an RF signal that may include the steps of selecting a filter device frequency band, filtering the RF signal using the filter device to produce a filtered signal, and outputting the filtered signal to a user (such as, for example, components of radio device, a display device, a computer, a memory location, a storage device, etc.). In these embodiments, selecting the filter device frequency band may include selecting a first filter stage mode of a first bimodal filter stage to produce a first frequency band, and selecting a second filter stage mode of a second bimodal filter stage to produce a second frequency band. In these embodiments, the filter device frequency band results from the first frequency band and the second frequency band.

In some embodiments of the present methods, selecting the filter device frequency band further includes selecting a third filter stage mode of a third bimodal filter stage to produce a third frequency band. In these embodiments, the filter device frequency range may also result from the third frequency band.

In some embodiments of the present methods, selecting the filter device frequency band further may include selecting the modes of M filter stages that are connected in cascade, each of which may be denoted as a filter stage of index m, where m is a positive integer ranging from 1 to M. Selecting the mode of an m'th bimodal filter stage produces an m'th frequency band. In these embodiments, the filter device frequency band may result from the m'th bands of each of the m'th stages.

One of skill in the art with the benefit of this disclosure will appreciate that the electrical lengths of some or all of the transmission lines (e.g., the "first transmission lines" and the "second transmission lines") of some embodiments of the present disclosure may be achieved through the use of synthetic transmission lines, which may facilitate more physically compact filter sizes.

As used herein the specification, "a" or "an" may mean one or more. As used herein in the claim(s), when used in conjunction with the word "comprising", the words "a" or "an" may mean one or more than one.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" may mean at least a second or more.

Throughout this application, the term "about" is used to indicate that a value includes the inherent variation of error for the device, the method being employed to determine the value, or the variation that exists among the study subjects.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. Thus, a method comprising certain steps is a method that includes at least the recited steps, but is not limited to only possessing the recited steps.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE FIGURES

The following drawings form part of the present specification and are included to further demonstrate certain aspects of the present invention. The invention may be better understood by reference to one or more of these drawings in combination with the detailed description of specific embodiments presented herein. The patent or application file contains at least one drawing executed in color. Copies of this patent or patent application publication with color drawing(s) will be provided by the Office upon request and payment of the necessary fee.

FIG. 6 depicts a simulation of the sixteen frequency responses achievable from an embodiment of a present RF filter device having four filter stages. The labels above each response correspond to the mode of each of the four filter stages within the RF filter device (e.g., (0110) corresponds to the filter device operating with the four filter stages being in: mode 0, mode 1, mode 1, and mode 0 respectively. The responses plotted in black and in blue represent the simulated ideal response, and the simulated response that includes imperfections resulting from losses in the transmission lines and switches, respectively. The responses plotted in dark red and in light red represent the simulated return loss due to ideal reflection only, and the simulated return loss that also includes other losses in the transmission lines and switches, respectively.

DESCRIPTION OF THE ILLUSTRATIVE EMBODIMENTS

Embodiments of the present disclosure present a multi-stage filter that takes advantage of the periodic response of the individual stages to achieve a selectable high-resolution bandpass response. By designing individual stages as bimodal switchable filters, a channel-select filter may be obtained that can cover from near DC to a maximum frequency $f_{max}$.

Figure 1A:
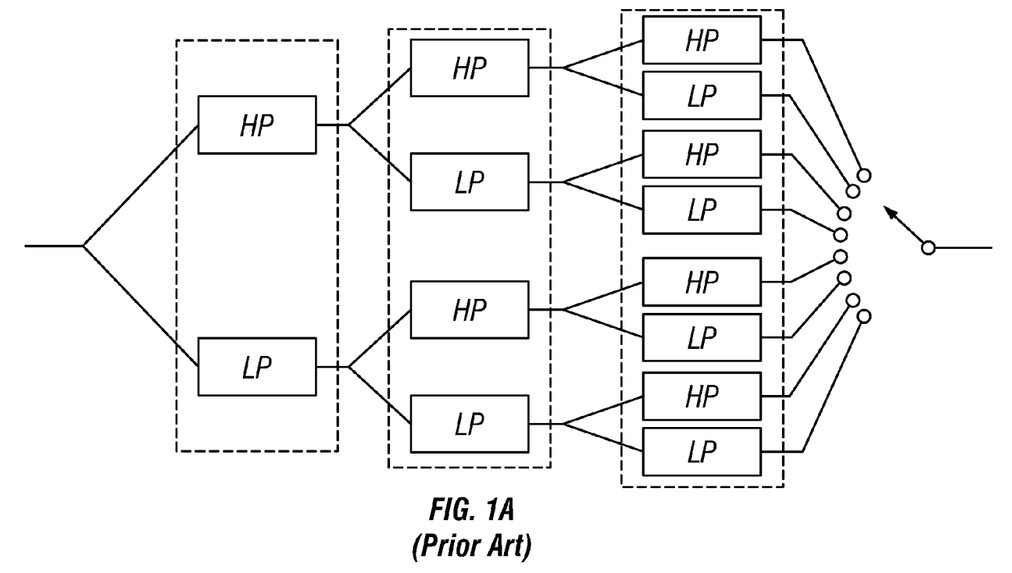
FIG. 1 is a schematic representation of a band-select filter made by a (a) multiplexer and its non-redundant implementation using cascaded multi-band bimodal filters. The two modes are distinguished using dark solid lines and thin dotted lines.
Figure 1B:
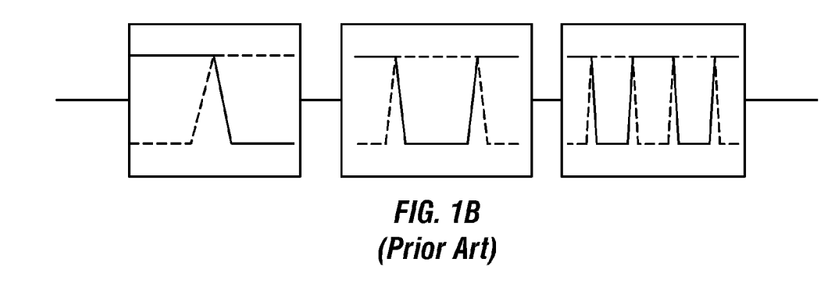

Cascaded filter structures have conventionally been used to make bandpass filters (Tang and Chen, 2007) or diplexer/multiplexers (Wenzel, 1965). The design of multiplexers based on few cascaded stages that form a hierarchical topology composed of highpass and lowpass structures is an example of cascade filtering implementation where the overall frequency response for each channel is found by multiplying the response of the individual filter stages in the path. A multiplexer can be used to make a band select filter by switching between different channels (FIG. 1A). Non-redundant implementation of this concept based on periodic filter stages have been also proposed for SAW channel-select filters (Hays et al., 1973) and fiber optics WDM filters (Lam et al., 1998). To achieve a channel-select function, each stage must have two or more different modes of operation. Bimodal filter stages are particularly attractive, as they result in a binary channel select scheme (FIG. 1B). As filtering is achieved in multiple stages with increasing band resolution, this topology may be referred to as multi-resolution channel-select filter (MRCS). Embodiments of the present disclosure provide an RF domain implementation of MRCS to achieve ultra-wideband channel-select function.

A nearly perfect periodic response is key to enabling a non-redundant RF implementation. While periodicity is automatically achieved in tapped delay line SAW filters or periodically loaded fiber optic filters, perfect periodicity in an RF implementation can be obtained if the filter is constructed entirely from commensurate segments of transmission lines (having electrical lengths that are multiples of a unit element value). One possible candidate for implementing the periodic stages is the optimum topology proposed for the design of couplers and high pass filters (Hong and Lancaster, 2001; Levy and Lind, 1968). A 2N−1 order filter of this type is realized as N short- or open-ended stubs of electrical length $\theta(f)/2$ separated by N−1 segments of $\theta(f)$ long transmission lines. If the stubs are open-ended and connected in shunt, the filter will have pass bands for $2n\pi-\theta_0 \leq \theta(f) \leq 2n\pi+\theta_0$, if they are short-ended, the pass bands will be between $2(n+1)\pi-\theta_0 \leq \theta(f) \leq 2(n\pi+1)+\theta_0$, where $\theta_0$ is determined by the impedance of transmission line segments and stubs and ideally n can be any integer number. Therefore switching the stubs from short to open ended will result in a shift in the frequency response. For $\theta_0=\pi/2$, pass-bands and rejection-bands for each mode have equal width and therefore a self-complementary switchable frequency response as shown in FIG. 1B is possible.

Embodiments of the present disclosure present a band select filter composed of switchable filter stages. To achieve a binary multi-resolution channel-select function, the electrical length of the unit elements may be doubled from one stage to the next (FIG. 2).

Figure 2:
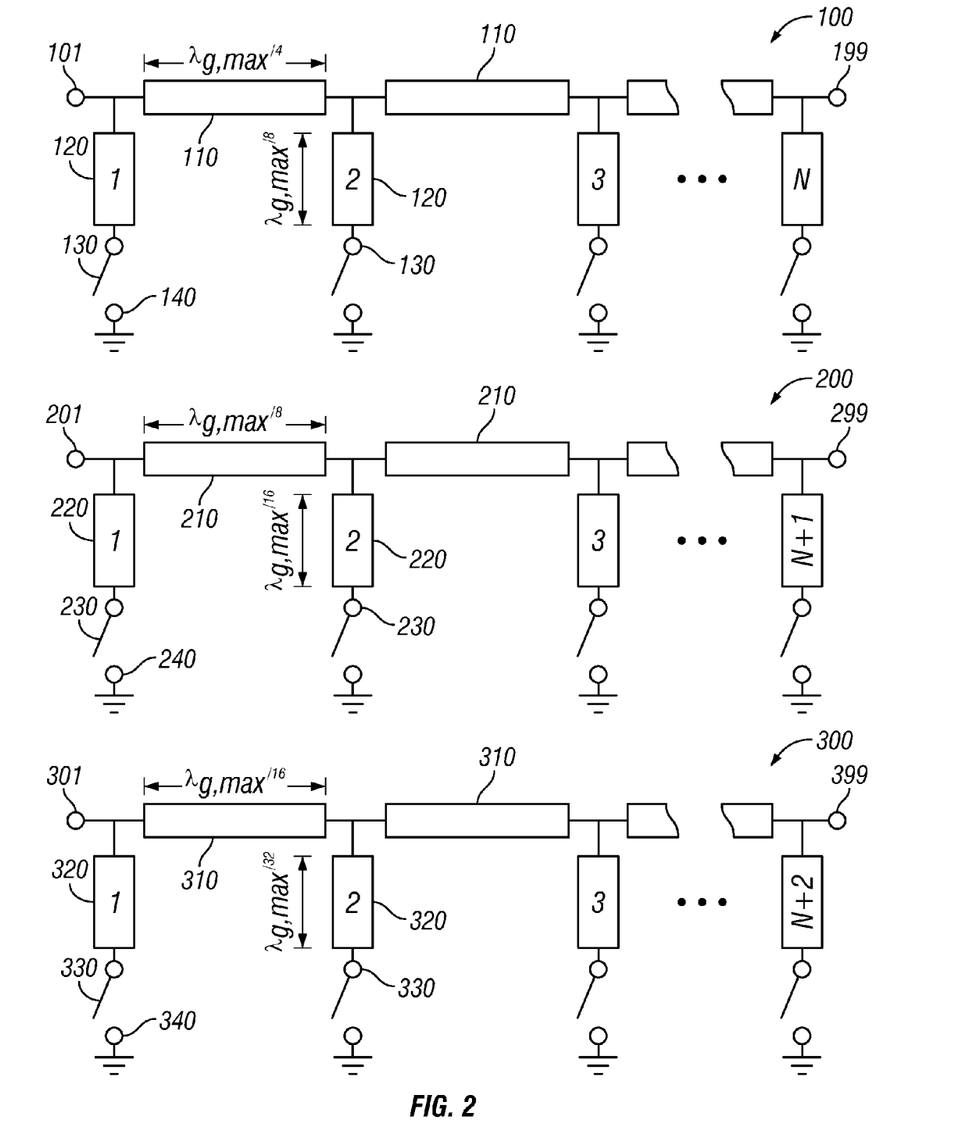
FIG. 2 depicts three filter stages of an embodiment of the present RF filter devices. The top stage has the finest resolution. The second and third stages have one-half and one-half resolution with respect to the first stage.

FIG. 2 depicts three switchable filter stages (100, 200, and 300) that may be connected in cascade in an embodiment of the present disclosure. Filter stage 100 contains filter stage input 101, filter stage output 199, filter stage ground 140, first transmission line 110, second transmission line 120, and switching means 130. First transmission line 110 and second transmission line 120 may be microstrip transmission line.

Filter stage 200 may be connected serially to filter stage 100 by connecting filter stage output 199 to filter stage input 201. Filter stage 200 may contain filter stage input 201, filter stage output 299, filter stage ground 240, first transmission line 210, second transmission line 220, and switching means 230.

Filter stage Filter stage 300 may be connected serially to filter stage 200 by connecting filter stage output 299 to filter stage input 301. Filter stage 300 may contain filter stage input 301, filter stage output 399, filter stage ground 340, first transmission line 210, second transmission line 320, and switching means 330.

A. Order and Arrangement of the Filters

If the filters have a sharp roll off at their cut off frequencies, at presence of a small amount of loss, the response of the impedance matched cascaded filters may be closely approximated by the multiplication of their individual frequency responses. If the filter stages do not have an adequate roll-off, spurious bands (spikes) can be generated at the overlapping transition regions. To maintain a consistent roll-off, the higher-order filters may be used for wider-band (lower-resolution) stages.

It should be noted that although the above discussion implies that the stages are cascaded from low to high resolution, the actual arrangement in which the filter stages are connected in the filter chain does not have any noticeable impact on the frequency response of different bands. However, in general a low order to high order arrangement may have a lesser nonlinear behavior.

B. Parasitic Effects

Switches, via holes, end-effect capacitors, bends, and T-junctions all introduce parasitic effects and, therefore, adversely affect the periodic frequency response of the filter stages. These effects, in addition to the dispersions of the transmission lines, can ultimately limit the consistent operation of MRCS in very wide frequency ranges. However, they can be compensated by simple layout provision for up to several gigahertz. In particular, switch parasitics and end-effects can be compensated by adjusting stub electrical lengths. The effect of bends and T-junctions can be minimized by using miters and notches (Kompa, 2005).

EXAMPLE

The following example is included to demonstrate a particular embodiment of the invention. It should be appreciated by those of skill in the art that the techniques disclosed in this example represent techniques found to function well in the practice of the invention. However, those of skill in the art should, in light of the present disclosure, appreciate that many changes can be made in the specific embodiments which are disclosed and still obtain a like or similar result without departing from the spirit and scope of the invention. For example, it will be appreciated to the artisan of ordinary skill that the number of channels; frequency range; number filter stages; frequency resolution; the current, voltage, resistance, capacitance, and inductance values; materials used; number of stubs (e.g., the number of transmission line paths switched to open circuit or ground); and voltages used in this example are specific only to this exemplary embodiment. One of skill in the art with the benefit of the present disclosure will appreciate that embodiments of the present disclosure may contain many different design choices addressing, for example, the number of filter stages and the number of stubs for each filter stage based on the desired performance of the embodiment.

Figure 3:
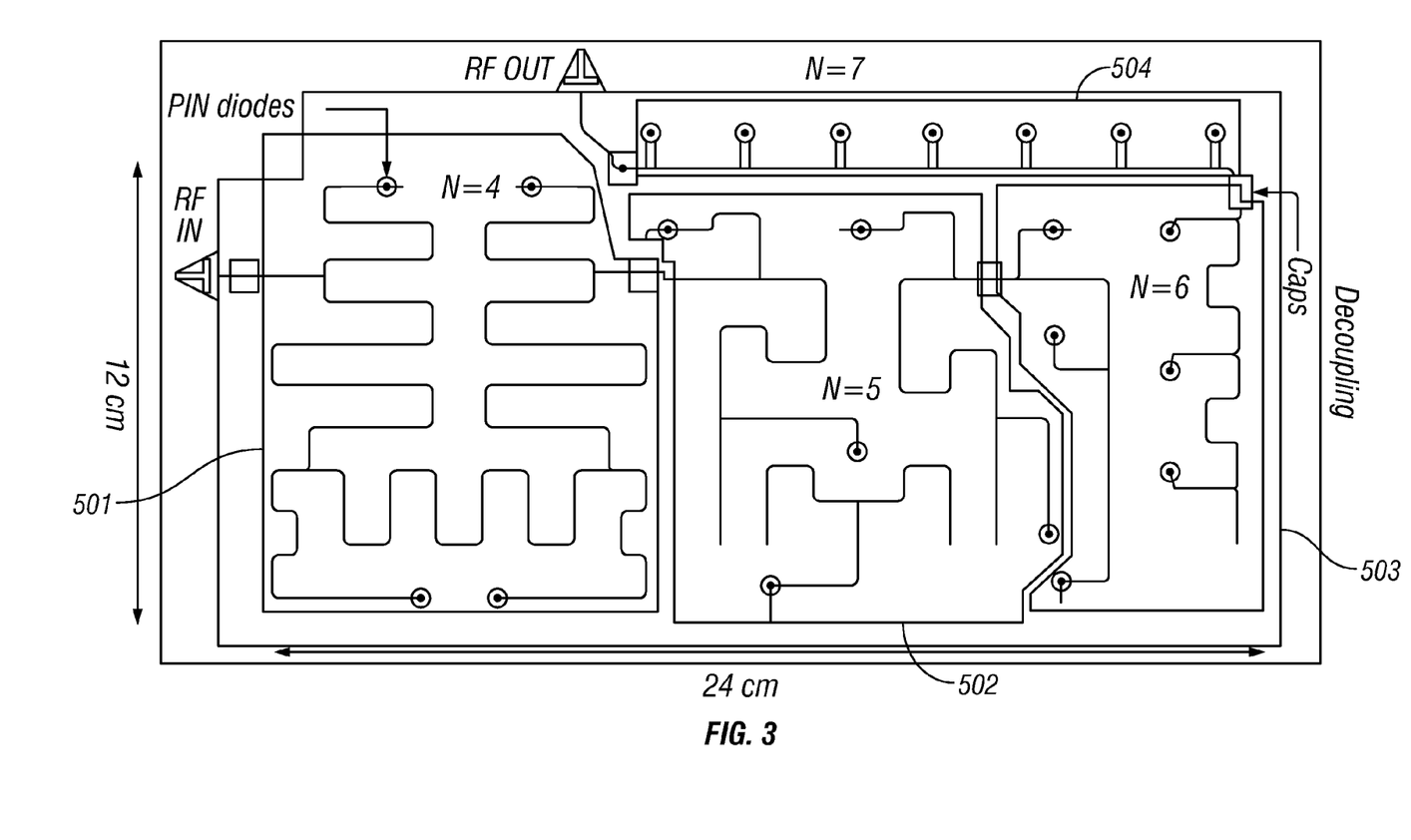
FIG. 3 is a photograph of a prototype embodiment that includes four filter stages with 16 bands covering the frequency range of DC to 2.5 GHz.
Figure 4A:
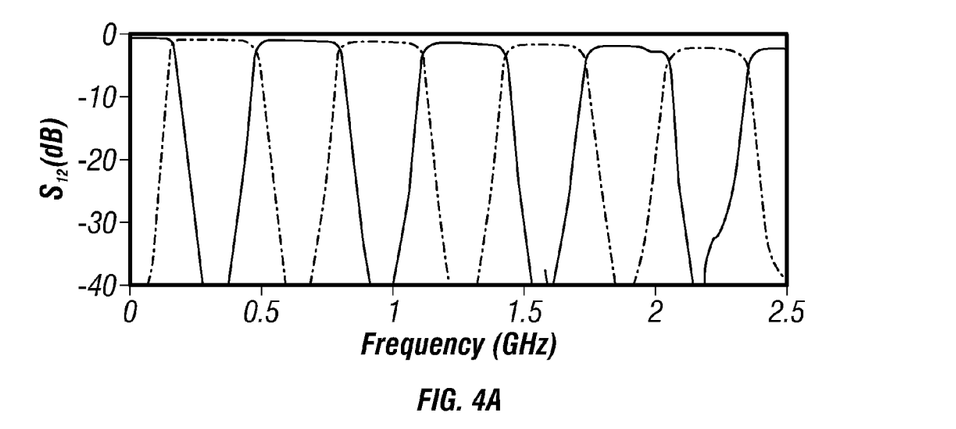
FIG. 4 depicts the simulated response of each of the four stages of the embodiment of FIG. 3: (a) 4th, (b) 5th, (c) 6th, and (d) 7th order filter. The responses depicted in solid lines and dashed lines represent the responses of the two modes of the bimodal filter stages, respectively. The response of the embodiment of FIG. 3 that contains the four stages is the overlap of the response of the four stages.
Figure 4B:
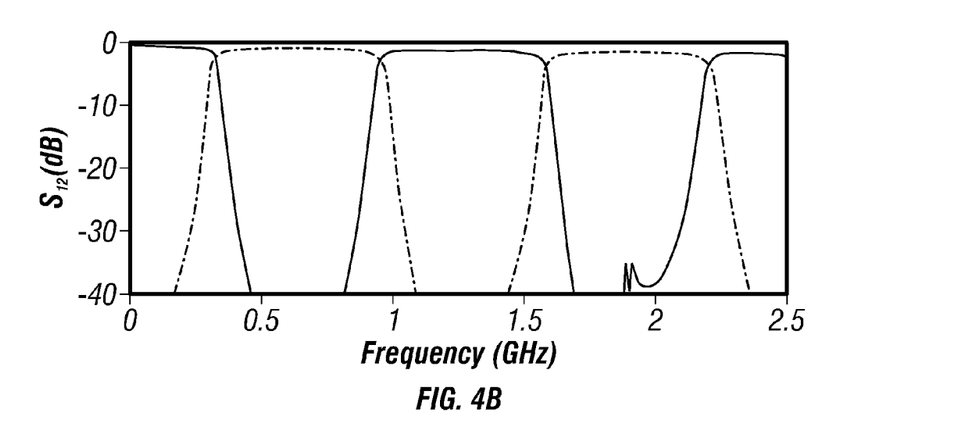
Figure 4C:
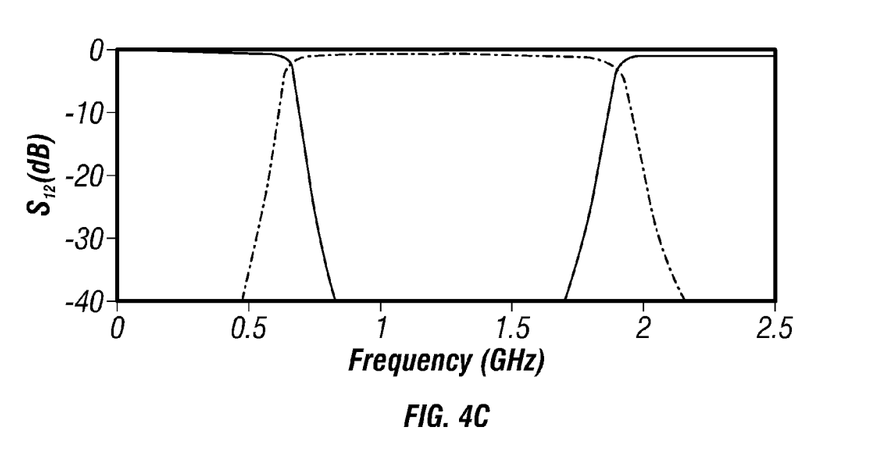
Figure 4D:
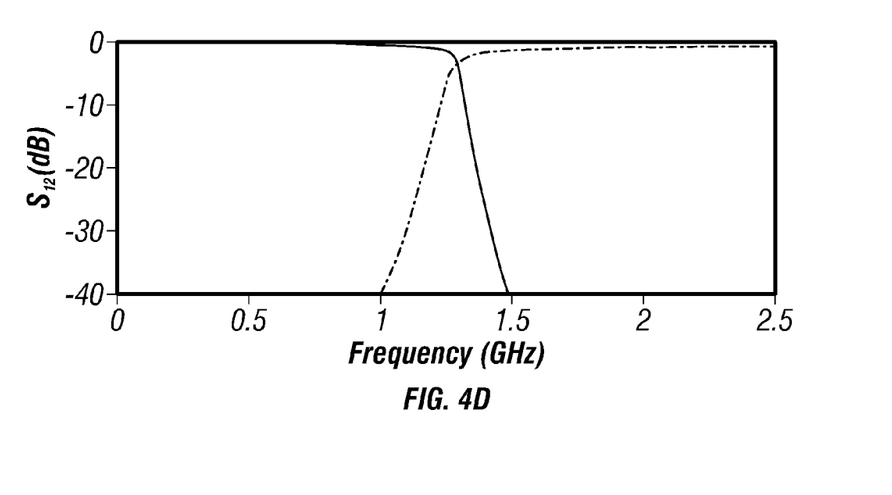

FIG. 3 shows a prototype of a 16-channel 0.001-2.5 GHz filter embodiment of the present disclosure that was designed as the cascade of four switchable (e.g., bimodal) filter stages, filter stages 501, 502, 503, and 504. In other embodiments, more than four, or as few as two bimodal filter stages may be used. In some embodiments, the number of filter stages used may be variable, thereby allowing for variable frequency resolution.

In the prototype embodiment, a fixed low pass stage is also added to the chain to eliminate the out of band spurious responses of the periodic stages. Maximum resolution in this prototype embodiment was measured to be 0.156 GHz (2.5 GHz/16), with the lower end of the tuning range being 1.5 MHz (dictated by five DC decoupling capacitors of 10 nF). In the prototype, switching in the filter stages is provided by PIN diodes located almost at the end of the stubs, with each switch being implemented as two parallel BAP65-02 PIN diodes. In prototype's off-state, a total of 0.7 pF parasitic capacitance shunts the end of the stubs to ground. In the prototype's on-state, each short-circuit path includes a total series parasitic inductance of 1 nH. The prototype's switches show almost 0.5 ohm series resistance at the 1.5 mA bias current per diode. The substrate used for this embodiment was the RO3010 from Rogers Corporation with $\in_r=10.2$ and tan $\delta=0.002$.

The number of stubs (the number of transmission lines switched to open circuit/ground) in each stage of the prototype embodiment was selected to minimize the level of near-band spikes in the frequency response by increasing the roll-off. For the highest resolution filter stage, N (the number stubs in the particular filter stage) was chosen as 4; followed by 5, 6, and 7 in subsequent filter stages (filter stages 501, 502, 503, and 504 corresponding to filter orders of 7, 9, 11, and 13). With this choice, the highest spurious spike was found to be at least 25 dB below the pass-band in all modes of operation.

In the cascaded topology of the prototype embodiment, the filter stages are DC isolated using series capacitors. Each filter stage can be independently switched by applying a DC voltage to the microstrips. This switching between open circuit and ground for all stubs within a filter stage may select between the two operational modes of the bimodal filter stages. The switches of the prototype embodiment are turned on by +20V bias and turned off with −25V bias.

FIG. 4 shows the simulated response of the individual filter stages of the prototype embodiment in their two modes of operation. The simulations are carried out in Momentum (Advanced Design System 2008, Agilent) and include all of the parasitic effects as well as the metallic and dielectric losses. Switch resistance and loss of the bias circuit have also been taken into consideration. These simulations show that near-ideal bands can be obtained by proper design. The insertion loss is the highest for the highest resolution filter. Reactive parasitic effects as well as the dispersive behavior of microstrip can potentially result in deviations from perfect periodic response. Particularly a "squeezing" effect can be observed at the higher order pass-band due to such effects. However, the bandwidth reduction was found to be less than 2% in the frequency range of interest. This effect is mostly consistent among all transmission lines. However in some cases corrections are necessary in the electrical length of the transmission lines to ensure proper passbands.

Figure 5A:
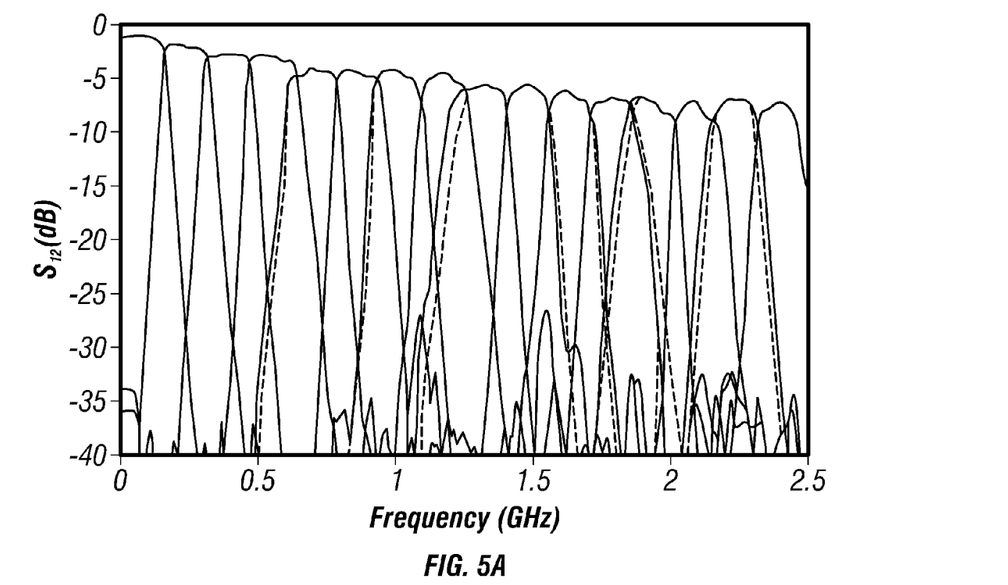
FIG. 5 depicts the overall frequency response of the prototype embodiment of FIG. 3 in all of the bands: (a) comparison between the simulation (dotted line) and measurement (solid line) responses, (b) the responses before (dotted line) and after (solid line) adding the final low pass stage, and (c) the reflection coefficient of the filter in different bands.
Figure 5B:
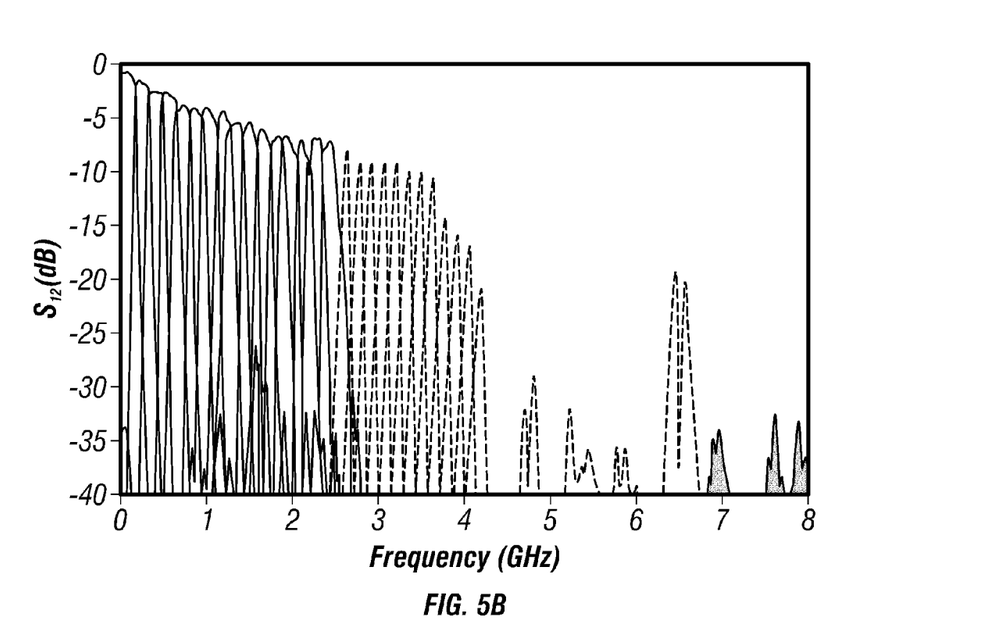
Figure 5C:
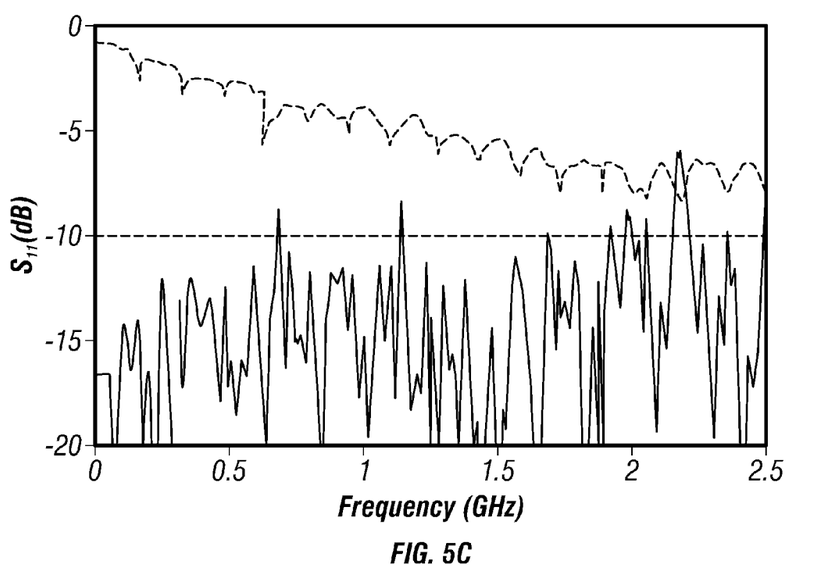
Figure 6:
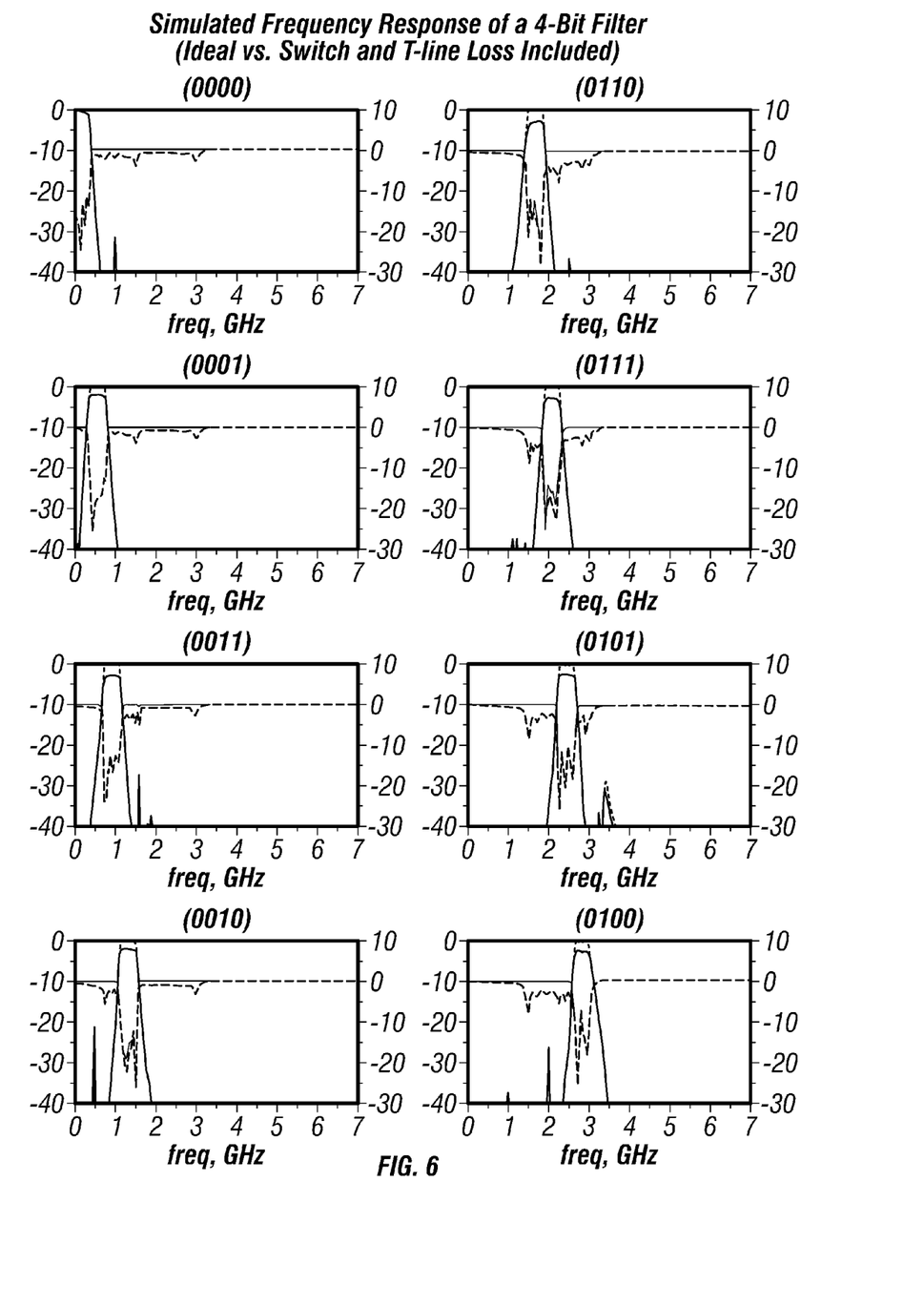

FIG. 5A depicts the measured frequency response of the prototype embodiment's 4-stage filter in 16 modes of operation. The simulated data from cascading the individual modes is also shown, presenting a high degree of fidelity in the simulations. The measured insertion loss varies from 0.7 dB at the lowest band to 6.5 dB at the highest band. It can be shown the frequency response in each band is effectively of an order 8. If the same response is to be implemented by 8 coupled resonators, the measured insertion loss would require an unloaded Q of 80 per resonator (at 1 GHz). The simulated Q's of the lines is >120 at the upper band frequencies. The effective Q is reduced due to the effects of the switches and bias resistors. FIG. 5C shows that the in-band reflection coefficients are very small.

Figure 7:
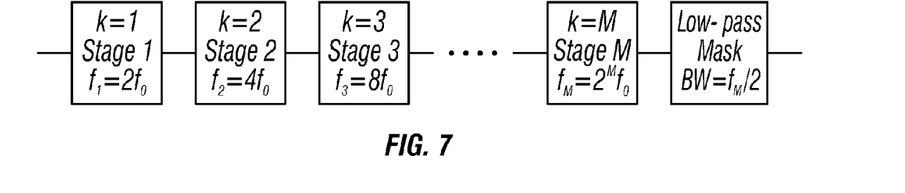
FIG. 7 depicts a schematic of an M-bit band-select filter using a chain of bi-modal switchable filter stages with periodic frequency response.

FIG. 7 depicts a schematic of an M-bit band-select filter using a chain of bi-modal switchable filter stages with periodic frequency response. As shown, in certain embodiments, the chain of filter stages can have M stages where M is an integer greater than 1. In some cases, M can be 2, 3, 4, 5, 6, 7, 8, 9, 10, 15, 20, 25, or any range of integers derivable between any of these integers.

Figure 8:
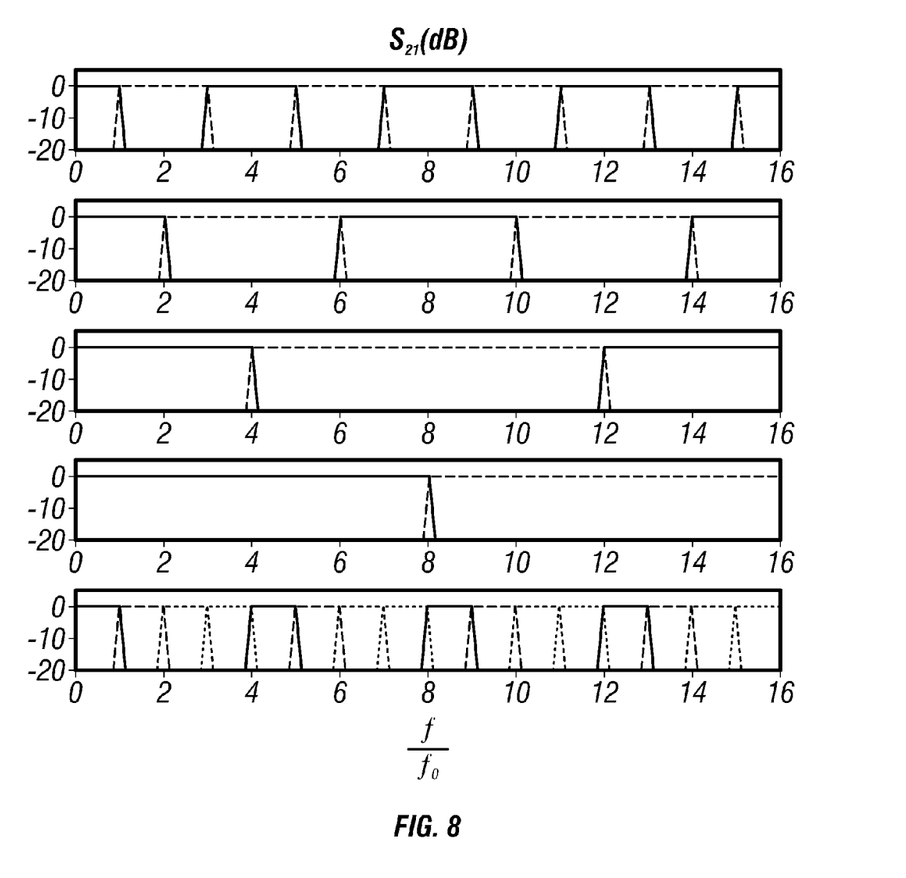
FIG. 8 depicts the frequency response of different stages of a 4-bit filter in two modes. The overall frequency response which is shown in the lower most graph is nearly equal to the multiplication of individual stages' transmission coefficient and has a bandwidth of $f_0$.

FIG. 8 depicts the frequency response of different stages of a 4-bit filter in two modes. The overall frequency response which is shown in the lower most graph is nearly equal to the multiplication of individual stages' transmission coefficient and has a bandwidth of $f_0$.

All of the embodiments disclosed and claimed herein can be made and executed without undue experimentation in light of the present disclosure. While the compositions and methods of this invention have been described in terms of some embodiments, it will be apparent to those of skill in the art that variations may be applied to the compositions and methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

The appended claims are not to be interpreted as including means-plus-function limitations, unless such a limitation is explicitly recited in a given claim using the phrase(s) "means for" and/or "step for," respectively.

REFERENCES

The following references, to the extent that they provide exemplary procedural or other details supplementary to those set forth herein, are specifically incorporated herein by reference.

Abbaspour-Tamijani et al., *IEEE Trans. Microwave Theory & Tech.*, 51(7)1878-1885, 2003.
Brown and Rebeiz, *IEEE Trans. Microwave Theory & Tech.*, 48(7):1157-1160, 2000.
Entesari and Rebeiz, *IEEE Trans. Microwave Theory & Tech.*, 53(3):1103-1110, 2005.
Hays et al., *IEEE Ultrasonics Symp. Dig.*, 456-459, 1973.
Hong and Lancaster, In: *Microstrip Filters for RF/Microwave Applications*, NY, J. Wiley & Sons, 2001.
Kompa, In: *Practical Microstrip Design And Applications*, Artech House, 2005.
Lam et al., *IEEE Jour. Lightware Tech.*, 16(9):1657-1662, 1998.
Levy and Lind, *IEEE Trans. Microwave Theory & Tech.*, 16(2):80-89, 1968.
Park et al., *IEEE Trans. Microwave Theory & Tech.*, 54(11): 3931-3939, 2006.
Sanchez-Renedo et al., *IEEE Trans. Microwave Theory & Tech.*, 53(1):191-199, 2005.
Siegel et al., In: *Very low complexity RF-MEMS technology for wide range tunable microwave filters*, 35th European Microwave Conference Proc., 1:637-640, 2005.
Tang and Chen, *IEEE Trans. Microwave Theory & Tech.*, 55(11):2412-2418, 2007.
Wenzel, *IEEE Trans. Microwave Theory & Tech.*, 13(1):5-15, 1965.

What is claimed is:

1. A tunable RF filter device comprising a plurality of filter stages that are connected in series, each filter stage including:
   a filter stage input;
   a filter stage output;
   a filter stage ground; and
   one or more first transmission lines, each first transmission line being connected to at least two connection nodes, each connection node being additionally connected to:
      either the filter stage input, the filter stage output, or another of the one or more transmission lines; and
   one of a plurality of second transmission lines, each second transmission line being additionally connected to a switching means;

where the switching means of each filter stage is configured to operate such that either each of the plurality of second transmission lines within that filter stage is provided an open circuit, or each of the plurality of second transmission lines within that filter stage is connected to the filter stage ground of that filter stage;

where the plurality of filter stages comprises a first filter stage;

each of the one or more transmission lines within the first filter stage is of about the same electrical length, which is denoted as L1;

each of the plurality of second transmission lines within the first filter stage is of about the same electrical length, which is denoted as L2; and L1 is about twice L2;

where the plurality of filter stages further comprises a second filter stage;

each of the one or more transmission lines within the second filter stage is of the about same electrical length, which is denoted as L3;

each of the plurality of second transmission lines within the second filter stage is of about the same electrical length, which is denoted as L4;

L3 is about L2; and

L3 is about twice L4.

2. The tunable RF filter device of claim 1, where the tunable RF filter device is implemented as an integrated circuit.

3. The tunable RF filter device of claim 1, where:

a number of the plurality of second transmission lines within the first filter stage is N;

a number of the one or more first transmission lines within the first filter stage is N−1;

a number of the plurality of second transmission lines within the second filter stage is N+1; and a number of the one or more first transmission lines within the second filter stage is N.

4. The tunable RF filter device of claim 3, where the tunable RF filter device is implemented as an integrated circuit.

5. The tunable RF filter device of claim 1, where:

the plurality of filter stages comprises M filter stages, each of which is denoted as a filter stage of index m, where m is a positive integer ranging from 1 to M;

each of the one or more transmission lines within the filter stage of index m is of about the same electrical length, which is denoted as $L1(m)$, and $L1(m+1)$ denotes a length of a first of the one or more transmission lines within a filter stage of index $(m+1)$ adjacent to the filter stage of index m;

each of the plurality of second transmission lines within the filter stage of index m is of about the same electrical length, which is denoted as $L2(m)$, and $L2(m+1)$ denotes a length of one of the plurality of second transmission lines within the filter stage of index $(m+1)$ adjacent to the filter stage of index m;

$L1(m)$ is about twice $L2(m)$;

$L1(m+1)$ is about $L2(m)$; and $L1(m+1)$ is about twice $L2(m+1)$.

6. The tunable RF filter device of claim 5, where:

a number of the plurality of second transmission lines within the filter stage of index m is N;

a number of the one or more first transmission lines within the filter stage of index m is N−1;

a number of the plurality of second transmission lines within the filter stage of index (m+1) is N+1; and a number of the one or more first transmission lines within the filter stage of index (m+1) is N.

7. The tunable RF filter device of claim 6, where the tunable RF filter device is implemented as an integrated circuit.

* * * * *